United States Patent [19]

Furuhata

[11] Patent Number: 5,336,911
[45] Date of Patent: Aug. 9, 1994

[54] SEMICONDUCTOR DEVICE

[75] Inventor: Tomoyuki Furuhata, Nagano, Japan

[73] Assignee: Seiko Epson Corporation, Tokyo, Japan

[21] Appl. No.: 975,129

[22] Filed: Nov. 12, 1992

Related U.S. Application Data

[63] Continuation of Ser. No. 691,448, Apr. 25, 1991, abandoned, which is a continuation of Ser. No. 329,561, Mar. 28, 1989, abandoned.

[30] Foreign Application Priority Data

May 10, 1988 [JP] Japan .................................. 63-111421

[51] Int. Cl.$^5$ ............................................. H01L 27/02
[52] U.S. Cl. ..................................... 257/273; 257/274; 257/346; 257/552; 257/754
[58] Field of Search .................. 357/43, 71, 67; 257/273, 274, 346, 552, 565, 566, 754, 755, 757

[56] References Cited

U.S. PATENT DOCUMENTS 4,451,328 5/1984 Dubois .......................... 357/715 X
4,901,134 2/1990 Misawa et al. ...................... 357/67

FOREIGN PATENT DOCUMENTS 0250721 1/1988 European Pat. Off. .............. 357/43

OTHER PUBLICATIONS

IEEE Journal of Solid State Circuit, vol. SC-21, No. 5, pp. 681-684 1986; "13-ns, 500 mW, 64-Kbit ECL RAM Using Hi-BICMOS Technology".
Extended Abstracts of 18th Conference on Solid State Devices and Materials, Tokyo, 1986 pp. 329-322, "A 7ns/350mW 16Kb HI-BICMOS RAM".

Primary Examiner—Rolf Hille
Assistant Examiner—Roy Potter
Attorney, Agent, or Firm—Ladas & Parry

[57] ABSTRACT

A Bi-MOS semiconductor device of the type having a bipolar device and a plurality of MOS devices formed on a principal surface of a semiconductor aubstrate and a method of producing the same. The device includes a plurality of element isolation regions each thereof being composed of a first semiconductor region formed in the semiconductor substrate and having the same type of conductivity as the semiconductor substrate, and a thick insulation layer formed on the first semiconductor region, and at least one of an emitter electrode and a collector electrode formed in the bipolar device, gate electrodes formed in the MBS devices, a low-resistivity polycrystalline layer formed by a buried contact from one of the MOS devices and a high-resistivity portion formed by a high resistivity polycrystalline silicon layer connected to the low-resistivty polycrystalline silicon layer are formed from a polycrystalline silicon layer formed by the same layer formation.

2 Claims, 7 Drawing Sheets

SEMICONDUCTOR DEVICE

This is a continuation of copending application Ser. No. 07/691,448 filed on Apr. 25, 1991, now abandoned which is a continuation application of Ser. No. 07/329,561 filed Mar. 28, 1989 which is now abandoned.

BACKGROUND OF THE INVENTION

The present invention relates to a semiconductor device and method of manufacturing the same and more particularly to a Bi-MOS semiconductor device which can be used for an ECL SCRAM (emitter-coupled logic static random access memory) and the like and a manufacturing method therefor.

Recently, owing to the development of larger-scale integration of semiconcudctor integrated circuit devices, the formation of diffusion layers by self-alignment process has come into use so that utilizing its advantages polycrystalline silicon has been used for the gate electrodes and the wiring from electrodes in the formation for example of Bi-CMOS devices, The following publications show examples in which a low-resistivity polycristalline silicon layer(s) are used for the formation of the gate electrodes of NOS devices as well as the formation of the emitter and collector electrodes of a bipolar device in a Bi-MOS device, Literature 1: Japanese Laid-Open Patent No. 55-157257
Literature 2: Japanese Laid-Open Patent No. 58-222556
Literature 3: Japanese Laid-Open Patent No. 60-38856
Literature 4: IEEE JOURNAL OF SOLID-STATE CIRCUIT, VOL.SC-21, No. 5, P.681–684, 1986; "13-ns, 500-mW, 64-Kbit ECL RAM Using HI-BICMOS Technology"
Literature 5: Extended Abstracts of 18th Conference on Solid State devices and Materials, Tokyo, 1986, P.329-322, "A 7 ns/350 mW 16 Kb HI-BICMOS Static RAM".

While, in the above-mentioned literatures, the polycrystalline silicon layer is used in the formation of the gate electrodes, the wiring using a buried contact, the high resistor connected in such wiring in a CMOS device and the electrodes, particularly the emitter electrode of a bipolar transistor, as regards the polycrystalline silicon layer which is particularly related directly to the construction of the present invention, the literatures 1 and 2 disclose Bi-CMOSs of the type formed using a single-layer type polycrystalline silicon layer composed of one and the same layer. On the other hand, the literatures 3 to 5 are directed to Bi-CMOSs formed using two layers of the polycrystalline silicon layer thus disclosing their uses for ECL-SRAMs.

As will be seen from these literatures, with the Bi-CMOS, one of the devices of the CMOS, e.g., the n-MOS is used as the memory device or cell of an SRAM and n-MOS, p-MOS and bipolar devices are used as peripheral circuit devices of the SRAM. In this case, there has been no instance in which the load resistor is formed by incorporating it in at least the first-layer polycrystalline silicon when the memory device is used in the form of a cell with a high-resistive load. In other words, in the above-mentioned literatures the present situation is such that the high resistor serving as a load is formed in the second-layer wiring layer, that is, it is formed by a so-called stacked structure.

With such conventional Bi-MOS integrated circuit device, particularly in order to attain a high level of integration when using such devices as an SRAM, the main trend has been such that memory devices are composed of cells of the resistive load type instead of the full CMOS type or depletion transistor load type (n-MOS E/D type). However, presently there has been no such device incorporating a high-resistivity polycrystalline silicon layer composed of a single layer-type polycrystalline silicon layer.

Moreover, while a multi-layer structure of polycrystalline silicon is effective in accomplishing a high level of integration of the planar type, its manufacturing method involves complicated processing steps and also steps become sharp with the resulting deteriorated step-coverage for the wiring layers, thereby giving rise to problems from wiring reliability point of view such as electromigration or stress migration. In addition, the cost is unavoidably increased by the complicated processing steps and therefore simplification of the processing steps presents a great problem.

SUMMARY OF THE INVENTION

The present invention has been made in view of the foregoing several problems, and it is an object of the invention to provide an improved structure of a Bi-MOS device which elimigrates any memory device construction of the multi-layer structure and requires the reduced number of processing steps and a method of manufacturing such Bi-MOS device.

Thus, in accordance with the present invention there is provided a Bi-MOS semiconductor device comprising element isolation regions each including e buried layer, a channel stopper region and a local oxidation layer or a thick insulation layer such like a trench insulation layer, and a polycrystalline silicon layer formed by the same layer forming step of the same polarity thereby forming an emitter electrode and, if necessary, a collector electrode of a bipolar device, a polycrystalline silicon layer forming a buried contact and a high-resistivity polycrystalline silicon layer connected to the polycrystalline silicon layer.

In accordance with the invention there is provided a method of manufacturing a Bi-MOS semiconductor device comprising a step of forming in a semiconductor substrate two semiconductor layers which are respectively of the same and different kinds of conductivity with respect to the semiconductor substrate, forming an epitaxial grown layer over the entire surface of the semiconductor substrate, romping wells of the same and different conductivity types, respectively, in the epitaxial grown layer, forming a channel stopper region of the same conductivity type in the epitaxial grown layer on each of buried layers of the same conductivity type and then forming a thick insulation layer, for example a local oxidation layer by local oxidation thereby farthing element isolation regions each including the buried layer of the same conductivity type, the channel stopper region and the thick insulation layer, and a step of forming first-channel MOS diffusion layers in the well of the same conductivity type and second-channel MOS diffusion layers and bipolar diffusion layers, respectively, on the wells of the different conductivity type. Then, openings, vias or holes for producing emitter and collector regions as well as an opening for burled contact of the MOS diffusion layer are formed simultaneously, and an emitter electrode and a collector electrode (if necessary), MOS gate electrodes and a polycrystalline silicon layer including a high resistivity region and adjoining a buried contact are formed by the same growing and processing steps. Then, an emitter region (and a collector lead-out region if necessary) and a buried contact region are formed through the diffusion of an impurity from the polycrystalline silicon layer. It is to be noted that the method may be such that of the previously mentioned electrodes, the collector electrode is formed by a layer of a metal such as an aluminum (Al) alloy in place of the polycrystalline silicon layer by a separate step.

In accordance with the present invention, by virtue of the fact that a p-type channel stopper region is formed in an epitaxial layer on a P+-type buried layer by the element isolation region forming step, the formation of the element isolation region including the p+-type buried layer, the channel stopper layer and the thick insulation layer such like local oxidation layer can be effected independently of the formation of a p-well and therefore the element isolation width can be reduced to a predetermined size without giving any consideration to the diffusion length for lateral direction of the p-well region. Also, due to the fact the electrodes of a bipolar transistor and NOS devices, a low-resistivity polycrystalline silicon layer for buried contact and a high resistivity region connected to the former layer are formed from a polycrystalline silicon layer made of one and the same layer, there is the effect of eliminating the step of forming particularly the high resistivity region by a second-layer polycrystalline silicon layer. In addition, the wiring layers including these electrodes can be formed from the polycrystalline silicon layer of one and the same layer and therefore bad influence factors affecting on the stepcoverage of the wiring layers from device formation point of view can be minimized.

DESCRIPTION OF THE PREFERRED EMBODIMENTS

Embodiments of a Bi-MOS semiconductor device and method of manufacturing the same according to the invention will now be described with reference to the drawings. Here, a Bi-CMOS transistor which is a hybrid device combining a bipolar device and a complementary NOS(CMOS) device will be described by way of example.

Embodiment 1

Figure 1:
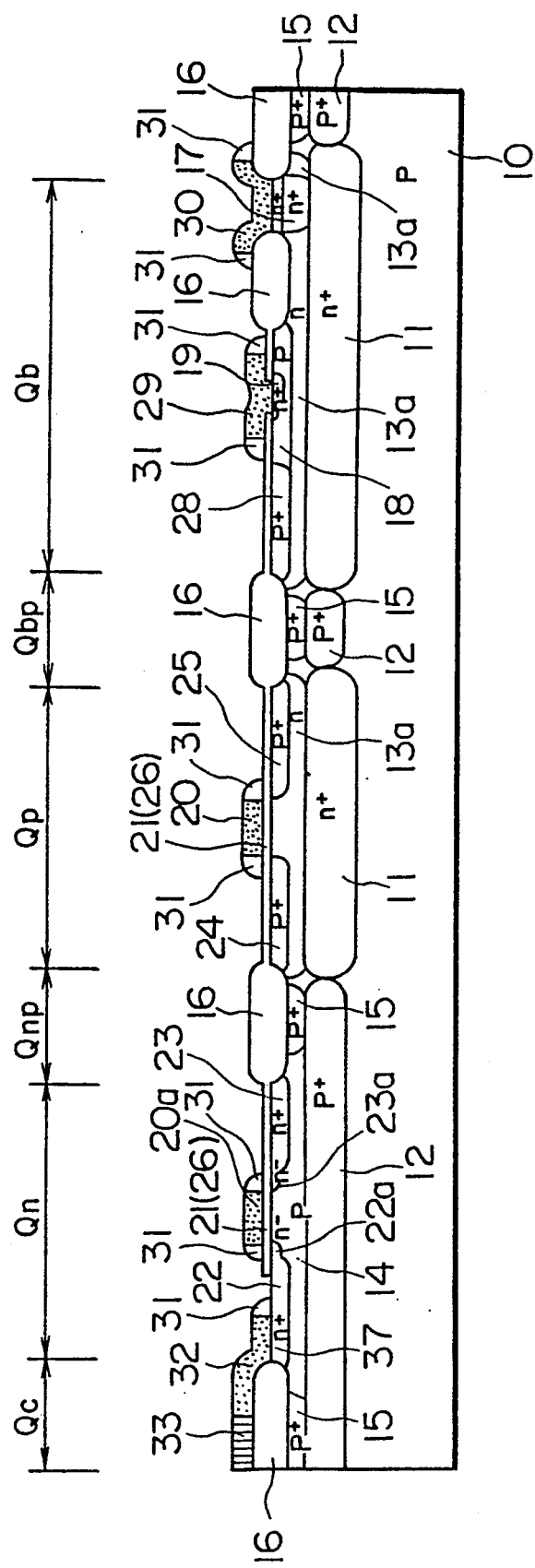
FIG. 1 is a schematic diagram showing the principal part of an embodiment of a Bi-CMOS semiconductor device according to the present invention.

FIG. 1 is a schematic sectional view showing the principal part of an embodiment of a Bi-CMOS semiconductor device according to the invention. This Bi-CMOS device includes a bipolar transistor Qb, an n-channel type MOSFET Qn and a p-channel type MOSFET Qp (a CMOS is formed by Qn and Qp) which are formed on the same p-type semiconductor substrate 10 so as to be arranged in place. It is to be noted that symbols Qbp and Qnp respectively designate the element isolation regions between Qb and Qp and between QD and Qn, and Qc a polycrystalline silicon layer forming a resistive layer portion for load which is connected to the wiring of a buried contact. Therefore, the construction of FIG. 1 has a structure suitable for an ECL SRAM composed of Bi-CMOS device, that is, an integrated circuit comprising for example memory cells each consisting of an n-MOS of Lhe highly-resistive load type and peripheral circuits composed of bipolar transistors or Bi-CMOS device.

The bipolar transistor Qb has an n-p-n construction and it is formed in an n-type well 13a formed in an n-type epiLaxial layer 13. The n-type well 13a forms a collector region and an n+-type buried layer 11 is formed below it. Also, a p-type base region 18 and a p+-type base region 28 are formed in the n-type well 13a, and an n -type emitter region 19 is formed in the base region 18. In addition, an n+-type collector diffusion layer 17 reaching an n+-type buried layer 11 is formed in another portion of the n-type well 13a. Then, an emitter electrode 29 composed of a polycrystalline silicon layer is formed through the opening or via on the n+-type emitter region 19, and a collector electrode 30 is similarly formed on the n+-type collector diffusion layer 17. While the collector electrode 30 is formed by the polycrystalline silicon layer, it may be formed by a layer of a metal such as an Al, Al-Si, Al- Cu or Al-Si-Cu or a multi-layer structure (a barrier metal and Al or the like) if occasion demands.

On the other hand, the p-channel Lype NOSFET Qp is formed in another n-type well 13 on another n+-type buried layer 11. A gate electrode 20, a gate oxidation layer 21, a p+-type source region 24 and a p+-type drain region 25 is formed in the n-type well 13a.

Also, the n-channel type MOSFET Qn is formed in a p-type well 14 on a p+-type buried layer 12. A p+-type channel stopper region 15 is formed around the p-type well 14. In addition, a gate elecLrode 20a, the gate oxidation layer 21, an n+-type source region 22 and an n+-type drain region 23 is formed in the p-type well 14. Note that the n-channel type MOSFET Qn has an LDD (lightly doped drain), structure including n−-type diffusion layers 22a and 23a.

On the other hand, in the resistive layer Qc of this embodiment, a highly-resistive load is provided by a high-resistivity polycrystalline silicon layer 33 formed so as to cover a field oxidation layer 16 and connected to a low-resistivity polycrystalline silicon layer 32 adjoining a portion of the n+-type source region 22 or the n+-type drain region 23. It is to be noted that the polycrystalline silicon layers 32 and 33 are formed, along with the emitter electrode 29 (including the collector electrode 30 if occaision demands) and the gate electrode 20 and 20a, by the same processing step.

As shown in the Figure, sidewall spacers 31 are formed on the sidewalls of the emitter electrode 29, the collector electrode 30, the gate electrodes 20 and 20a and the low-resistivity polycrystalline silicon layer 32.

While the construction of the Bi-CMOS according to the invention has been described, the structure of the element isolation regions Qbp and Qnp forming another essential requirement of the invention will now be described. The element isolation region Qbp between the bipolar transistor Qb and the p-channel type MOSFET Qp is composed of a p+-type buried layer 12, a p+-type channel slopper region 15 formed on the p+-type buried layer 12 simultaneoulsy with the p+-type channel slopper region 15 formed around the p-type well 14 of the n-channel type MOSfET Qn and a field oxidation layer 16. This structure is also applied to the element isolation region between the n-channel type MOSFET Qn and the p-channel type MOSFET Qp as well as the element isolation region (not shown) between the bipolar transistors.

While the construction of the Bi-CMOS device according to the present invention has been described, its operation is well known in the art and will not be described. The devicewise features and the like of the above-described construction will be enumerated as follows:

(a) The element isolation structure shown in the form of the p+-type buried layer /p+-type channel slopper LOCOS structure makes it possible to form element isolation regions independently of the forming step of a p-type well 14, so that there is no need to consider the diffusion length of the well for lateral direction and thus the element isolation width can be decreased.

In addition, the impurity profiles in the element isolation regions according to the above-described structure can be suitably adjusted in the course of the forming step of the p+-type buried layers 12 and the forming step of the p+-type channel stopper regions 15, so that by optimizing these impurity profiles, it is possible to reduce the element isolation width a value close to the element isolation width of a bipolar integrated circuit device of the ordinary isoplanar structure, thereby greatly reducing the occupied area for device and realizing a semiconductor integrated circuit device which is high in integration level.

(b) Since the emitter electrode (including the collector electrode if occasion demands) of a bipolar transistor, an n+-type polycrystalline silicon layer (one and the same layer of the same polarity) forming the gate electrodes and the buried contact of a CMOSFET and a nondoped polycrystalline silicon layer for high resistor which is to be formed continuous to the polycrystalline silicon layer for buried contact are all formed from a polycrystalline silicon layer of one and the same layer, all of them can be formed by a polycrystalline silicon layer forming only a first layer thus reducing the fabrication steps.

(c) Since the sidewall spacers are provided on the sidewalls of the electrodes or the wiring of the above-mentioned polycrystalline layer excluding the high resistivity layer, particularly in the case of the n-channel type NOS, the LDD structure is used to enchance the immunity for hot electrons due to the increasing fineness. (In this case there is no ill effect even if the p-channel type MOS is designed to have the LDD structure if occasion demand.) This has the resulting effect that since the polycrystalline silicon layer steps are made gentle by the sidewall spacers, the stepcoverage of the wiring layers formed on the polycrystalline silicon layer through the insulating layers is improved and the reliability of the wiring layers, such as, the electromigration resistance and the stress migration resistance are improved. As a result, the permitting current supplied to the wiring layers can be increased even in Lhe case of an ECL device having the possibiliLy of flowing a large current. In addition, the use of a multilayer structure (e.g., an double Al layer structure) for the wiring layer can be easily realized so that by applying such structure to word lines or the like, it is possible to reduce the wiring delay and accomplish a higher-speed operation of the devices.

It is to be noted that while the collector lead-out portion, i.e., the collector electrode may be composed of a metal electrode such as an Al electrode, to form it with polycrystalline silicon is preferable for realizing a higher integration level.

In this embodiment, the select oxidation film is used for one portion of the component of the element isolation regions. However, instead of this select oxidation film, the structure in which a trench is formed in the substrate to enter the insulating material therein, can be also used. Namely, so long as the thick insulation layer, it might be good to use. This is also applied to the case of embodiment 2 and 3.

Embodiment 2

Figure 2A:
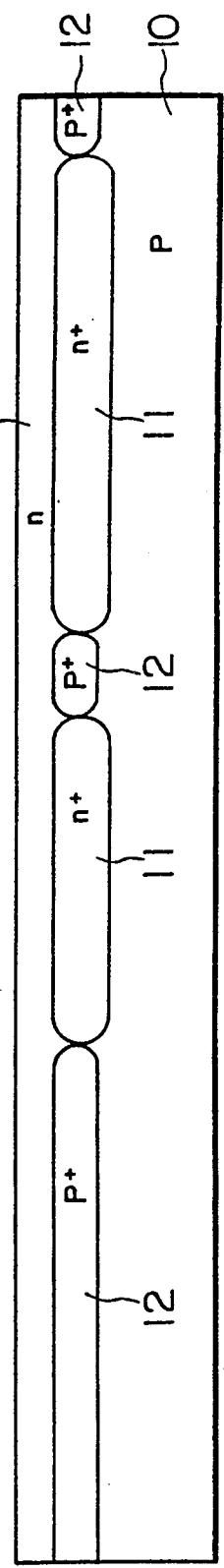
FIGS. 2(A) to (P) illustrate a flow sheet in the form of schematic sectional views showing an embodiment of a method of manufacturing a Bi-CMOS semiconductor device according to the present invention.
Figure 2B:
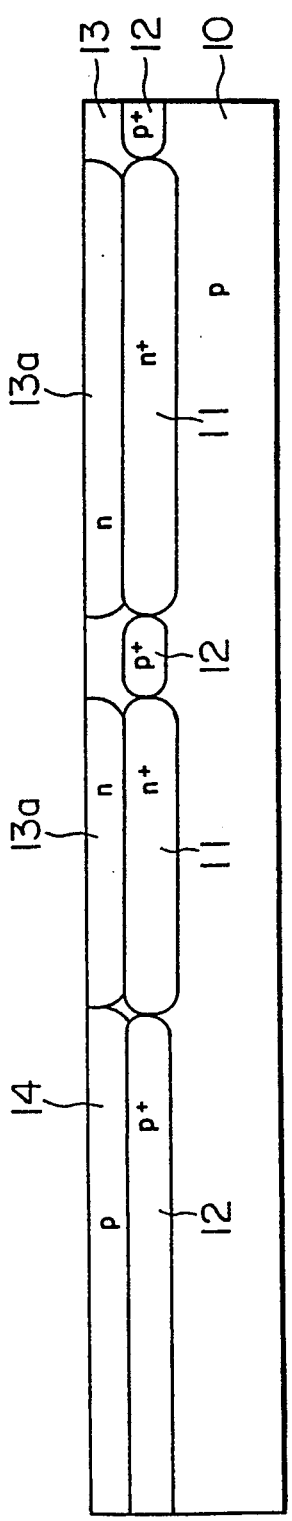
Figure 2C:
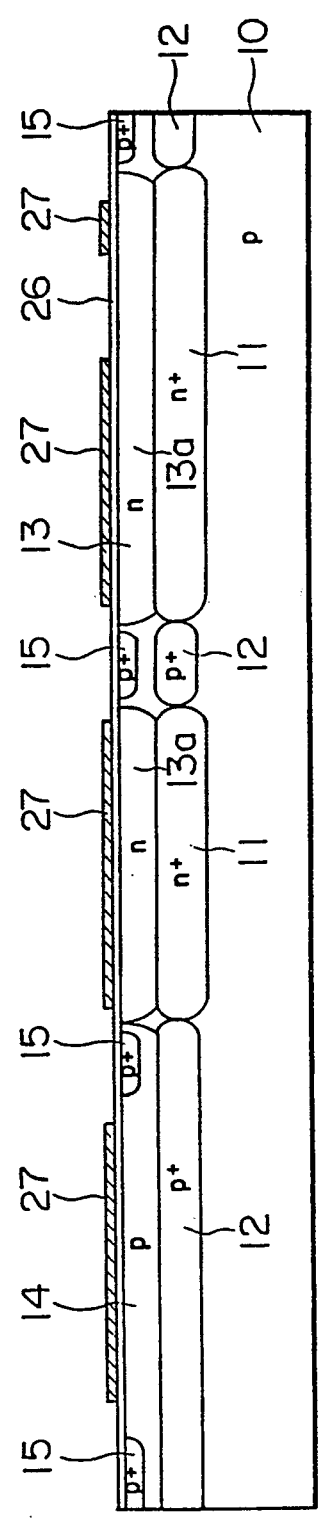
Figure 2D:
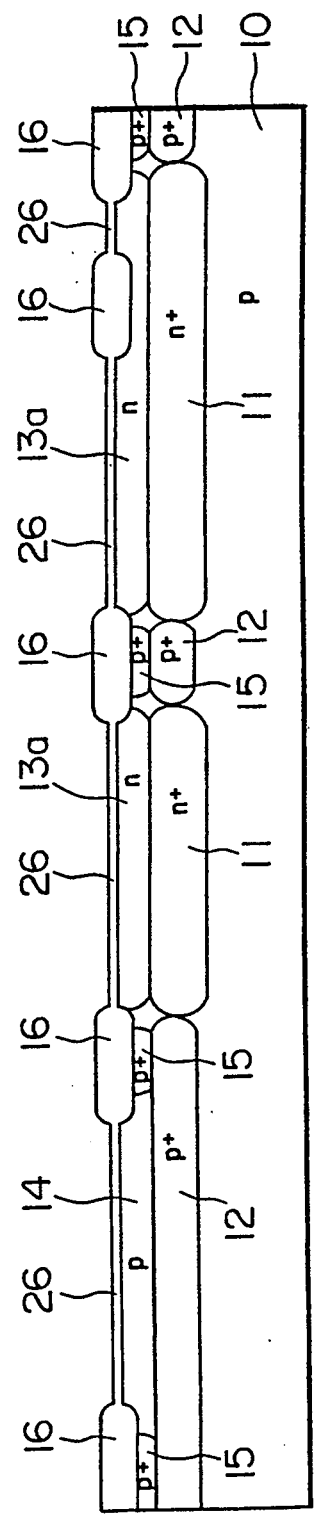
Figure 2E:
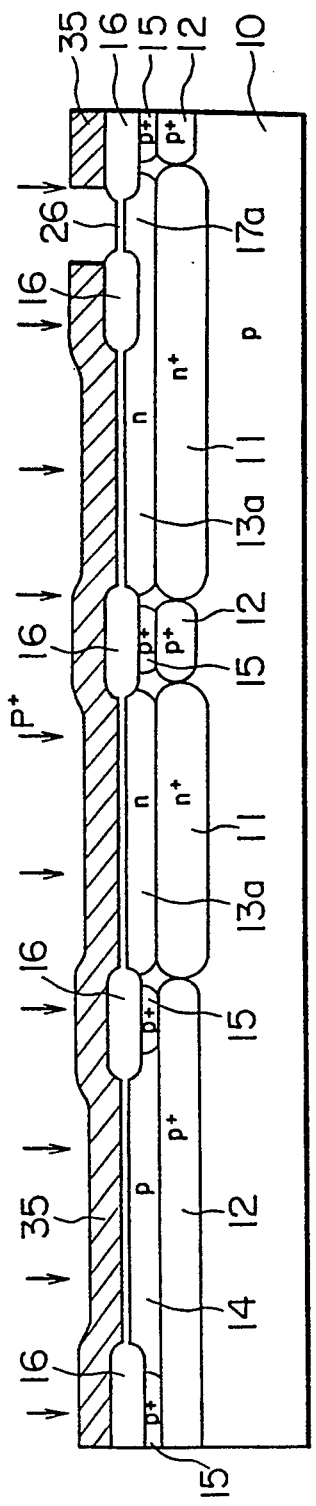
Figure 2F:
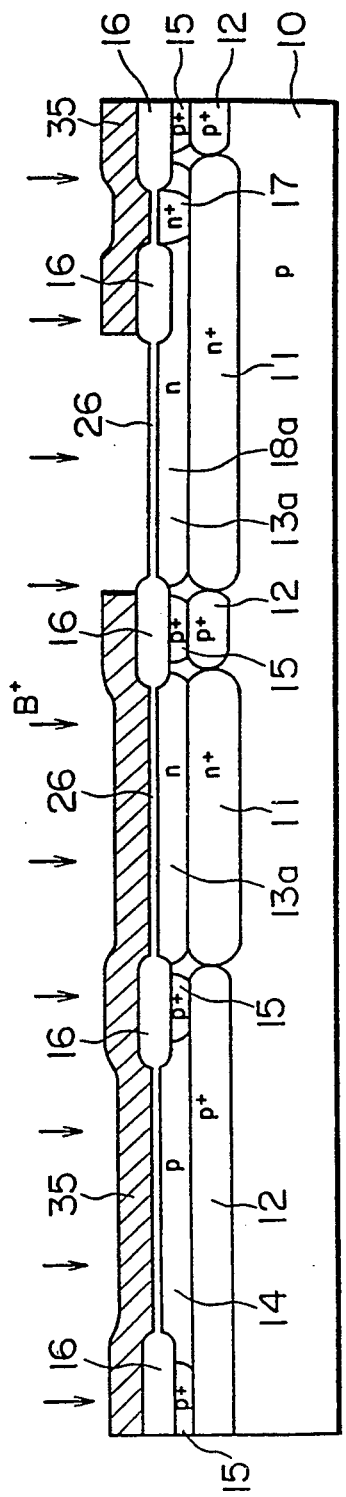
Figure 2G:
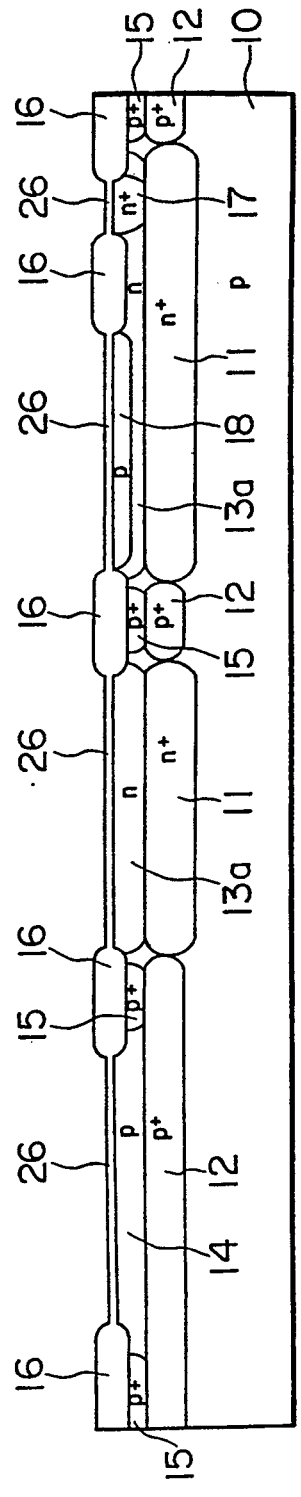
Figure 2H:
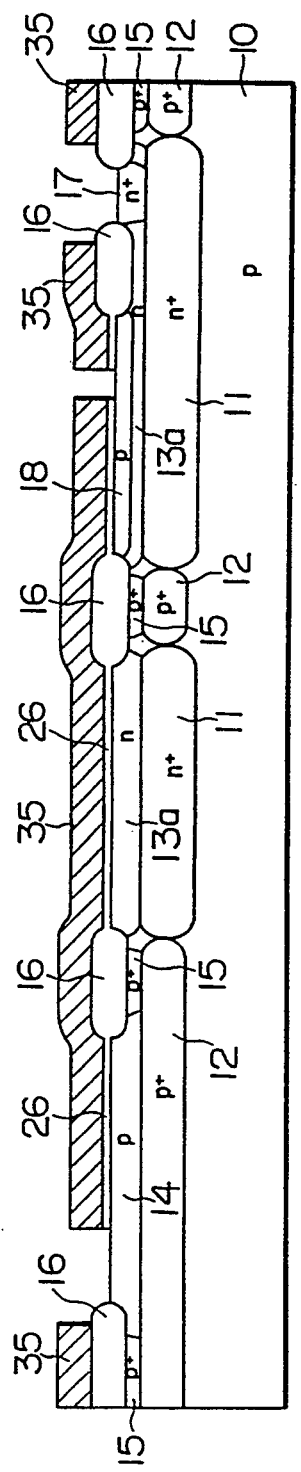
Figure 2I:
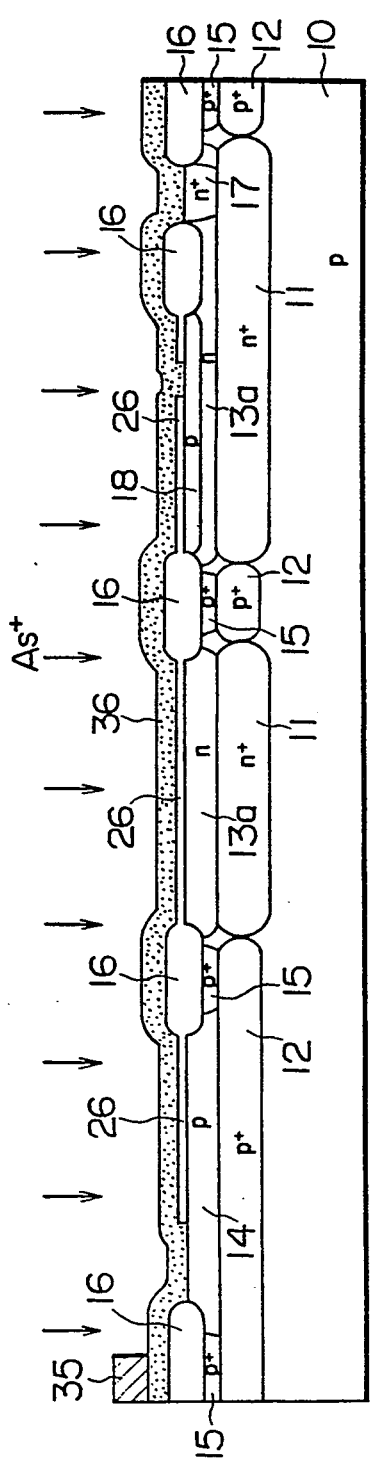
Figure 2J:
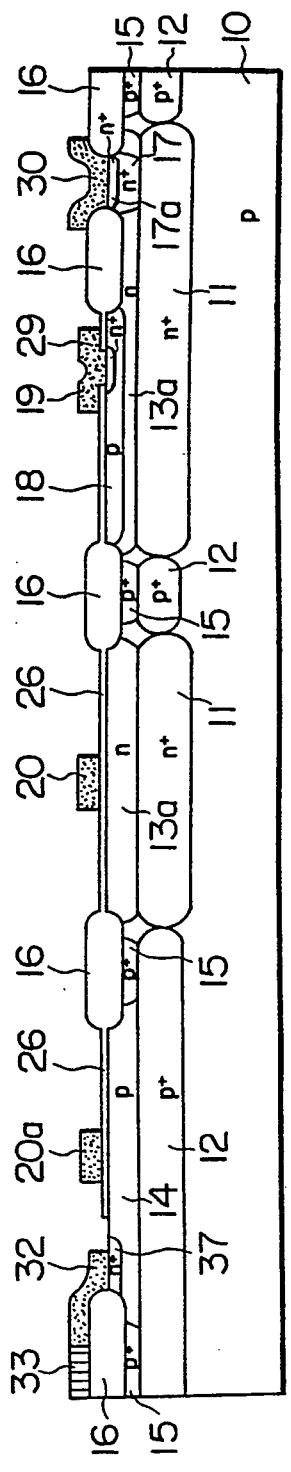
Figure 2K:
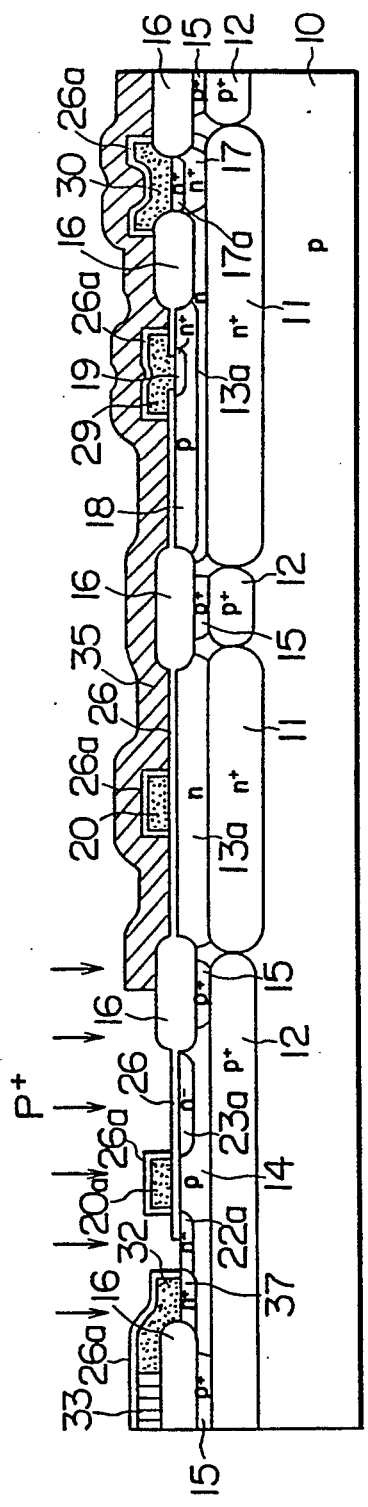
Figure 2L:
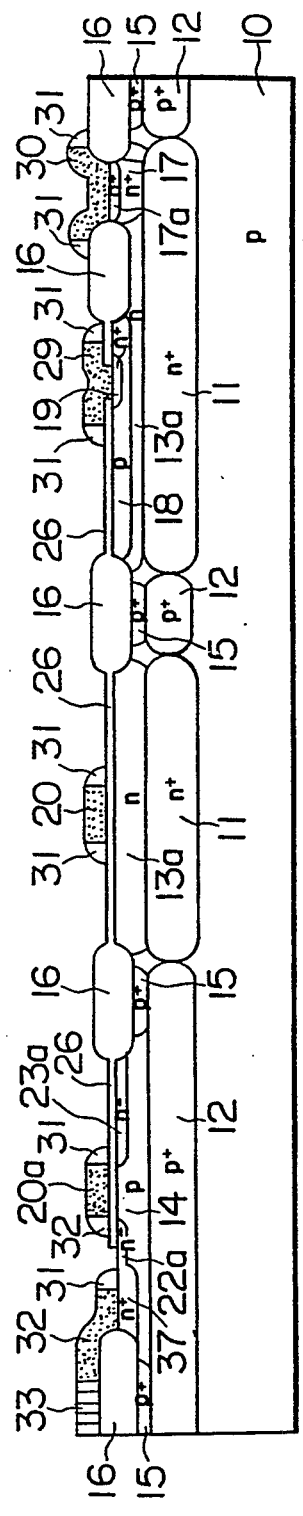
Figure 2M:
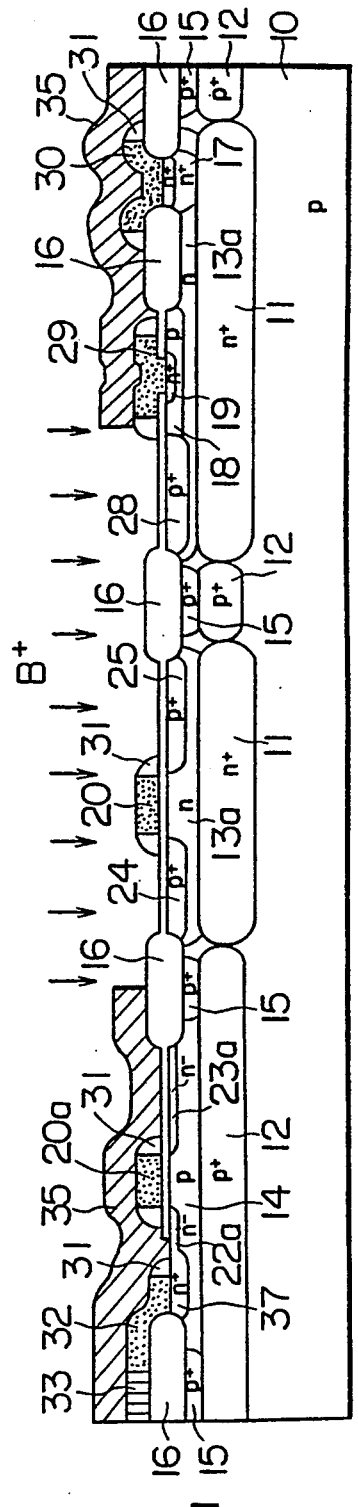
Figure 2N:
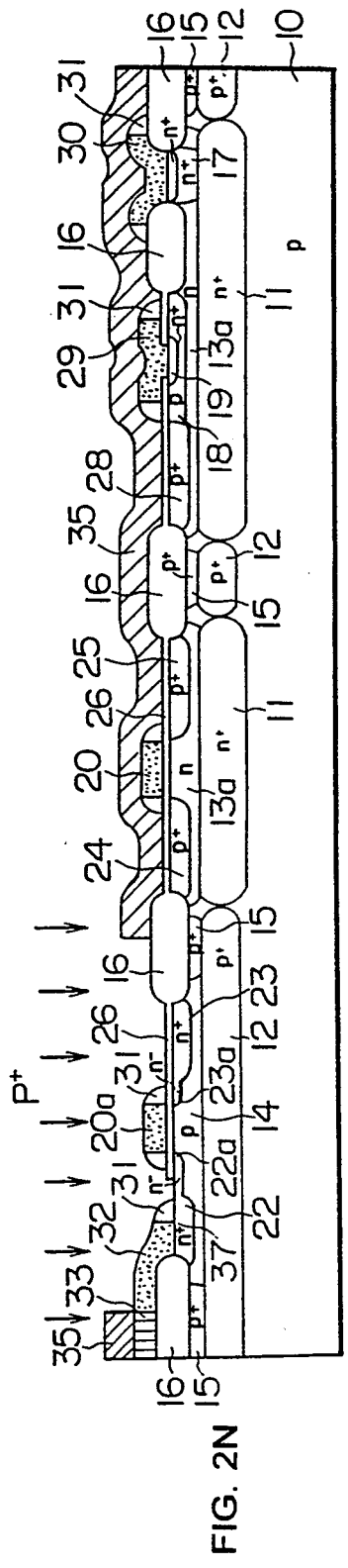
Figure 2O:
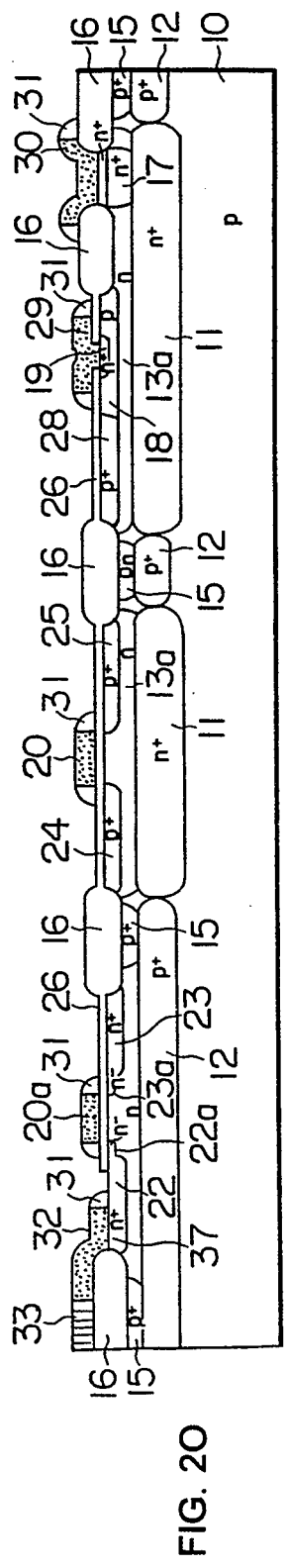
Figure 2P:
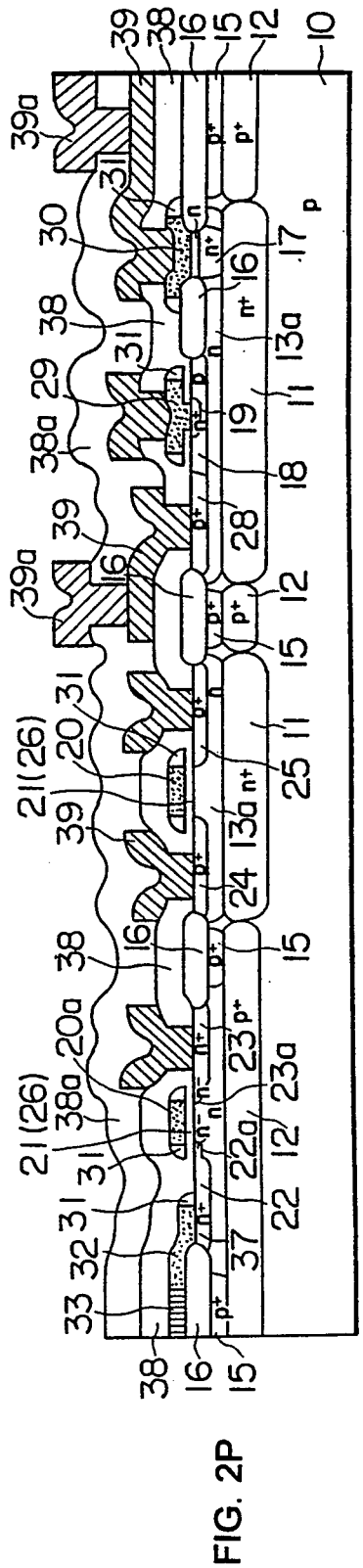

FIGS. 2(A) to (P) are step diagrams showing a method of manufacturing a Bi-CMOS semiconductor device according to the invention. The steps and formation conditions of the step diagrams (A) to (P) will now be described in this order. Note that in the Figures the component parts which are identical or equivalent to their counterparts in the embodiment of FIG. 1 are designated by the same reference numerals and symbols.

(A) The burying diffusion of an n+-type impurity, e.g., As(Arsenic), St(Antimony) or P(Phosphorous) and the burying diffusion of a p+-type impurity, e.g., B(Boron) in a p-type semiconductor substrate 10 are first performed to form n+-type buried layers 11 and p+-type buried layers 12 in desired position and then an n-type epitaxial layer 13 is formed by epitaxial growth. The layer thickness of the n-type epitaxial layer 13 is for example 0.5 to 3 $\mu$m and the impurity concentration is for example $5 \times 10^{14}$ to $5 \times 10^{16}$cm$^{-3}$. Here, the n+-type buried layers 11 are formed under the bipolar device region and p-channel type MOSFET device regions, and the p+-type buried layers 12 are formed under the n-channel type MOSFET device region and the element isolation regions.

(B) Then, after an opening has been etched in a resist layer, a boron impurity is introduced by ion implantation into the n+-type epitaxial layer 13 of the n-channel type MOSFET forming region above the p+-type buried through a light oxidation layer (not shown) formed on the surface of the substrate 10.

Then, after the removal of the resist layer which is not shown, a phosphorous impurity is introduced by ion implantation in the like manner above the n+-type buried layer 11 in the p-channel type MOS FET and bipolar device forming regions. Then, after the resist layer has been removed, drive-in diffusions are effected thereby forming a p-type well 14 and n-type wells 13a respectively. Then, the light oxidation layer is removed and this condition is shown in the Figure.

(C) After a light oxidation layer 26 has been formed again over the entire surface, a silicon nitride layer 27 is selectively formed on the respective device forming regions and the ion implantation and drive-in diffusion of boron are effected by use of a resist layer (not shown) which is formed with etched openings on the p+-type buried layer 12, thereby forming p+-type channel stopper regions 15. In this case, the p+-type channel stopper regions 15 are respectively formed around the p-type well 14 whereon n-channel type MOS device is to be formed and the element isolation regions. Then, only the resist layer is removed and selective oxidation by LOCOS (local oxidation of silicon) is performed on the p+-type channel stopper regions 15.

(D) As the result or the sLep (C), the thick field oxidation layer 16 by the LOCOS are formed on the p+-type channel sloppers regions 15 and the light oxidation layer 26 are left in place. While the field oxidation layers 16 are formed on the portions other than the device forming regions, the formation of the thick field oxidation layers 16 by the LOCOS brings the lower side of each of the p+-type channel stopper regions 15 into contact with the upper portion of the associated p+-type buried layer 12, thereby completing, the element isolation regions which constitute one of the essential requirements of invention.

(E) Then, a via hole is etched by a photoetching method in a resist layer 35 above a collector forming region 17a and the ion implantation of phosphorous (P) is performed. Then, after the resist layer 35 has been removed, a heat treatment is performed thereby diffusing the phosphorous.

(F) After the n+-type collector region 17 has been formed by the step (D), an opening is formed by the photoetching method in a resist layer 35 above a base forming region 18a and the ion implantation of boron (B) is performed. Then, after the resist layer 35 has been removed, the diffusion of the boron is effected by a heat treatment.

(G) At this stage, the basic regions of a bipolar device, i.e. the n+-type collector region 17 and the p-type base region 18 are formed in the condition where the element isolation reglons have been formed by the step (D).

(H) After a resist layer 35 has been applied onto the entire surface, as shown in the figure, a collector region, an emitter region and a buried contact region are etched in this order from the right and a wet etching is performed by using for example a solution such as HF:$NH_4F = 1:6$, 1:4 or 1:20, thereby opening the collector region, the emitter region and the buried contact region in the oxidation layer 26 (including the gate oxidation layers). Then, the resist layer 35 is completely removed temporarily.

(I) After a polycrystalline silicon layer 36 has been deposited by the CVD method to a thickness of 2000 to 5000 Å over the entire surface, a resist layer 35 is applied and then removed by the photoetching method to leave the resist layer 35 covering the portion of the high-resistivity polycrystalline silicon layer (this resist layer may be a silicon oxide layer formed to a thickness of 1000 to 10000 Å on the polycrystalline silicon layer). Thereafter, an ion implantation using arsenic (As) ions is performed under the conditions of 60 to 100 keV and $5 \times 10^{15}$ to $2 \times 10^{16}$ cm$^{-2}$. In this case, while the implantation of p+(phosphorous) may be effected in place of As+, this step converts the polycrystalline silicon layer 36 excluding the portion under the resist layer 35 to a low resistivity n+-type polycrystalline silicon layer. Thereafter, the resist layer 35 is removed.

(3) The n+-type polycrysLalline silicon layer 36 is etched by the photoetching method to form an emitter electrode 29, a collector electrode 30, gate electrodes 20 and 20a, a polycrystalline silicon layer 32 for buried contact and a high-resistivity poly crystalline silicon layer 33. Thereafter, annealing treatment is performed at 900° to 1000° C. for 20 to 40 minutes in an N$_2$ atmosphere so that the As in the respective polycrystalline silicon layers is diffused thereby forming an emitter region 19, a collector lead-out region 17a and a buried contact region 37. By virtue of this step, the respective regions can be formed into shallow junctions of about 0.1 to 0.2 μm in depth.

(K) The entire surface is subjected to a light oxidation at 800° to 1000° C. for about 20 minutes to form a thin oxidation layer 26a on these electrodes and the polycrystalline silicon layers and then a resist layer 35 is applied by the phoLoeLching method to the portion other than the n⁻-type offset regions 22a and 23a. The ion implantation of P (phosphorous) or As (arsenic) is performed into the n⁻-type offset regions 22a and 23a having no application of the resist layer 35, thereby forming n⁻-type diffusion layers of offset regions 22a and 23a. Then, the resist layer 35 is removed.

(L) Then, after a silicon oxide layer (not shown) has been deposited over the entire surface, an etch back by anisotropic etching (RIE) is performed to form a sidewall spacer 31 on each of the sidewalls of the n+-type polycrystalline silicon layers. It is to be noted that the sidewall spacers may be formed by using a PSG layer or a BPSG layer in place of the silicon oxide layer.

(M) After a resist layer 35 has been deposited by the photoetching method on the portions other than a p-channel MOS region and a base region, the ion implantation of boron (B) is performed. Note that boron fluoride (BF$_2$+) may be implanted in place of B(boron) ions.

(N) Then, after a resist layer 35 has been formed on the portion other than an n-channel NOS region by the photoetching method, the ion implantation of phosphorous (P) is performed and the resist layer 35 is removed. Then, a heat treatment is performed thereby forming a p+-type source region 24, a p+-type drain region 25 and a p+-type base region 28 composed of p+-type diffusion layers and an n+-type source region 22 and an n+-type drain region 23 composed of n+-type diffusion layers. By virtue of this step, the n-channel type MOSFET is formed by the LDD structure. In this case, the ion implantation may be performed by using As+.

(O) As the result or the above-mentioned steps (A) to (N), the basic portions of a Bi-CMOS semiconductor device according to the invention, i.e., one such as shown in FIG. 1, are formed as shown in this step diagram.

(P) Although any detailed description of the following processing steps will be omitted, after a first interlayer insulator 38 (including a second interlayer insulator 38a) has been deposited by the conventional technique, openings or vias are etched in the interlayer insulators and wiring layers 39, electrodes 39a for wiring, etc., are formed, thereby completing the Bi-CMOS semiconductor device having the previously mentioned effects.

Embodiment 3

Figure 3:
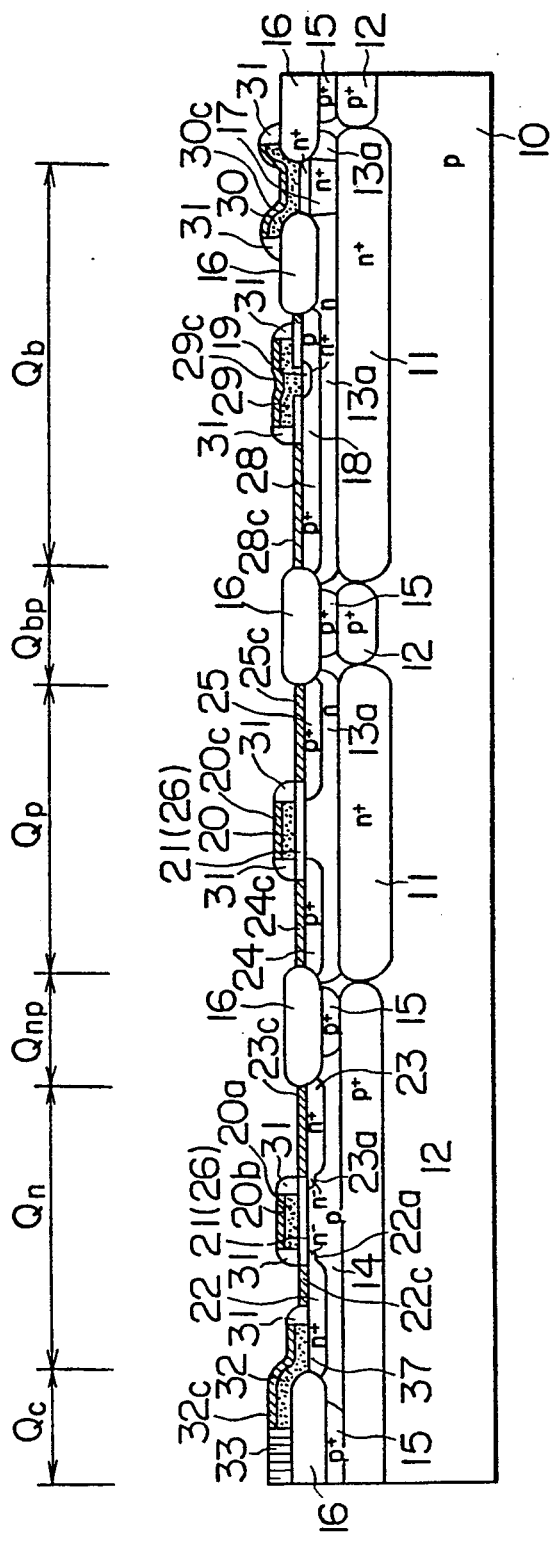
FIG. 3 is a schematic sectional view showing an embodiment of a structure adapted for high-speed operation of the embodiment of the Bi-CMOS semiconductor device of FIG. 1.

FIG. 3 is a schematic sectional view showing an embodiment of a construction for operating the Bi-CMOS semiconductor device according to the embodiment of FIG. 1 at high speeds.

The Bi-CMOS semiconductor device shown in FIG. 3 includes titanium silicide (TiSi$_2$) layers 32c, 20c, 20b, 29c, 30c, 22c, 23c, 24c, 25c and 28c on the polycrystalline silicon layer 32 for buried contact, the gate electrode 20, the gate electrode 20a, the emitter electrode 29, the collector electrode 30, the n+-type source region 22, the n+-type drain region 23, the p+-type source region 24, the p+-type drain region 25 and the p+-type base region 28, respectively.

The present embodiment features that the low-resistivity metal silicide layers are provided on the diffusion layers forming the source and drain regions and the polycrystalline silicon layers excluding the high-resistivity portion. This decreases the emitter resistance, the collector resistance and the base resistance of the bipolar transistor as well as the source resistances, the drain resistances and the gate resistances of the MOS transistors, thereby accomplishing the operation of the devices at higher speeds.

Figure 4:
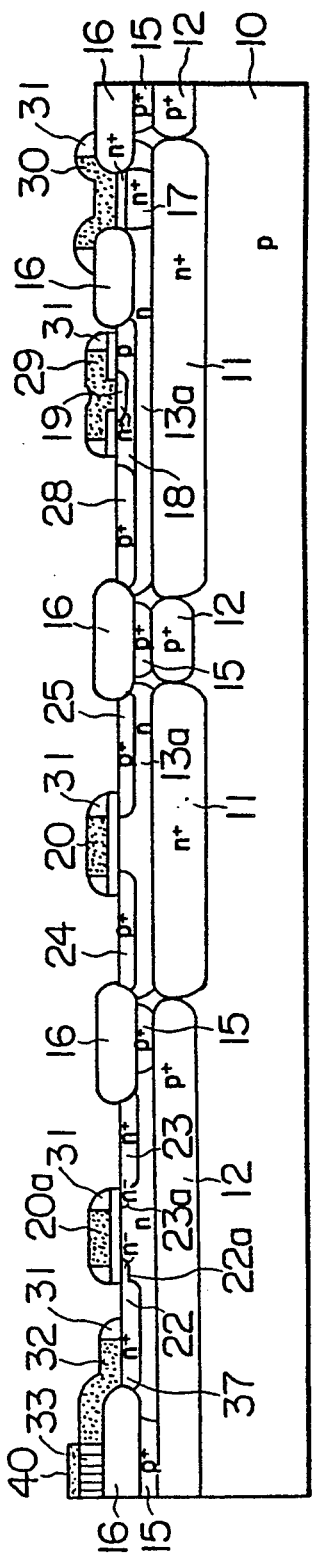
FIG. 4 is a sectional view silowing one stage or the manufacturing steps or the embodiment of the device shown in FIG. 3.

Next, the method of manufacturing the semiconductor device according to the embodiment shown in FIG. 3 will be described on the basis of FIG. 4 in reference to FIGS. 2(A) to (P).

Firsfly, after the steps of FIGS. 2(A) to (O) described in connection with the embodiment 2, a CVD oxide layer is formed to a thickness of 200 to 500 Å over the entire surface. Then, the CVD oxide layer on those regions where a metal silicide iayer is to be formed is removed by photoetching by photoetching by employing a wet etching solution such as $HF:NH_4F = 1:20$. The resulting construction includes the remaining CVD oxide layer 40 on the high-resistivity polycrystaiiine 33 silicon layer as shown in FIG. 4.

Then, Ti (titaninum) is deposited by sputtering to a thickness or 200 to 1000 Å over the entire surface. Then, in an argon atmosphere, the deposited titanium contacting with the silicon is silicidized in a self-aligning manner by a lamp anneaiing at 600° to 900° C. for 10 to 60 seconds. At this time, the deposited titanium not in contact with the silicon is not silicidized as a matter of course. This is called as a salicide (self align silicide)-structure.

Then, the unreacted titanium or the titanium which was not silicidized is selectively etched and removed by using such solution as sulruric acid/oxygen peroxide ($H_2SO_4/H_2O_2$) or $NH_4OH/H_2O_2/H_2O$.

In addition, the titatinum reacted with the silicon is completely silicidized in sn argon atmosphere by lamp annealing at 700° to 1000° C. for 10 to 60 seconds to convert it to $TiSi_2$, thereby attaining the device structures up to the stage shown in FIG. 3. The subsequent steps are the same with those described in reference to FIGS. 2(O) and (P) for the embodiment 2.

It is to be noted that while, in the present embodiment, titanium is used as a metal which is converted to a metal (refractory metal) silicide, there will be not problem even if it is replaced with W(tungsten), Pt (platinum), Co (cobalt) or $M_o$(molybdenum) to obtain such metal silicide as $WS_{i2}$, $P_tS$, $C_oSi_2$ or $M_oS_{i2}$.

While, in the embodiments 1 to 3, the n-channel MOSFET is of the LDD structure, even if the p-channel MOSFET is made to have the LDD structure depending on the purpose, its effect will not be lost. Also, the formation of the n-type wells 13a may be eliminated as occasion demands.

Further, while the present invention has been described in detail by way of its embodiments, it is needless to say that the invention is not limited to these embodiments and many changes and modifications may be made thereto without departing from its scope and spirit.

As described hereinabove, the invention has the below-mentioned great effects by virtue of the following features of the construction of the semiconductor device and its manufacturing method according to the invention.

(1) In the Bi-MOS semiconductor device according to the invention, the element isolation structure is composed of a buried layer, a channel stopper region and a local-oxidation layer a thick insulation layer such like the trench insulation layer and thus the element isolation width can be decreased considerably. As a result not only the fabrication step of the element isolation regions is simplified with the resulting reduction in cost but also the occupied area for device is decreased, thereby ensuring a very high level of integration from this aspect alone.

(2) There are another effects that the impurity profiles of the element isolation regions can be optimized through adjustments in the course of the buried layer forming step and the channel stopper region forming step, that an excellent element isolation characteristic without interelement leak is ensured and so on.

(3) Since the electrodes of the respective devices and the wiring for buried contact which is connected to the high-resistivity portion of the NOS device used as a memory cell are formed from only a single layer of one and the same polycrystalline silicon layer having the same polarity and the sidewalls of these polycrystalline silicon layer portions are provided with the sidewall silicon layer spacers, the steps are gentle and the stepcoverage of the wiring layers formed on the steps through the insulating layer are made satisfactory, thereby improving considerably the unavoidable difficulties from the device forming point of view.

(4) The operation of the devices at higher speeds is accomplished by the provision of the low-resistivity metal silicide on the polycrystalline silicon layers excluding the high resistivity portion and the diffusion layers thereby decreasing these regions in resistivity.

Thus, the resulting devices are improved in electromigration resistance and stressmigration resistance and the devices are improved greatly in reliability. Also, the operating speeds of the devices are considerably improved. This point can be considered to be an important effect in consideration of the fact that the electromigration resistance of the wiring layers becomes a problem particularly in the case of an ECL device in which the amount of current flow is large The above-mentioned effects make easy the realization multilayer wiring comprising two or more layers of aluminum in the formation of devices and thus the use of this wiring as word lines for memory cells has the effect of reducing the wiring delay and contributing toward higher speed operation of the devices, thereby making possible the application of the invention to TTL (transistor-transistor logic) type SRAMs and ECL type SMRAMs which are high in speed and integration level and low in power consumption.

(5) By virtue of the construction and its manufacturing method capable of simultaneously realizing a bipolar transistor of a polycrystalline silicon emitter structure, a buried contact structure and the following high resistivity portion, it is possible to easily accomplish higher integration level, higher speed and lower power consumption for devices, thereby making easy the application of the invention to high-speed logics and memory devices requiring high resistivity.

What is claimed is:

1. A Bi-MOS type semiconductor device comprising a first bipolar element and at least one of a CMOS element, said CMOS element comprising p- type and n-type MOS transistors, and second bipolar element are provided in one principal surface of a semiconductor substrate having an element isolation region provided in said semiconductor substrate and having a first semiconductor region of a same conductivity type as said semiconductor substrate and a selective insulation layer, wherein:

a polycrystalline silicon layer of one conductive type forms at least one of emitter or collector electrodes of at least one of said first and second bipolar elements;

a low-resistivity polycrystalline silicon layer forms a gate electrode of said CMOS element;

a low-resistivity polycrystalline silicon layer with a buried contact forms an electrode selected from source and drain electrodes of said CMOS element;

a metal silicide layer comprised of at least one metal element selected from a group consisting of Ti, W, Mo, Pt and Co is formed on each of diffusion layers forming said source and drain electrodes of said CMOS element and a base region of at least one of said first and second bipolar elements; and a high-resistivity polycrystalline silicon layer forms a high resistive element connected to said low-resistivity polycrystalline silicon layer, said low-resistivity silicon layers being in one layer formation, said element isolation region comprising said first semiconductor region in said semiconductor substrate having the same conductivity type a said semiconductor substrate, an independent second semiconductor region of said same conductivity type contiguous to said first semiconductor region at the bottom thereof and in a semiconductor layer of a conductivity type different from that of said semiconductor substrate, and a selective insulation layer formed on said semiconductor region, and the composition and width of said first semiconductor region, second semiconductor region and selective isolation layer being at least similar with one another.

2. A semiconductor device according to claim 1, wherein said emitter electrode is composed of said polycrystalline silicon layer, and said collector electrode is connected to a collector lead-out region that is a metal layer.

* * * * *